US008810144B2

(12) United States Patent
Hu et al.

(10) Patent No.: US 8,810,144 B2
(45) Date of Patent: Aug. 19, 2014

(54) DRIVER CIRCUITS FOR DIMMABLE SOLID STATE LIGHTING APPARATUS

(75) Inventors: Qingcong Hu, Morrisville, NC (US); Praneet Athalye, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/462,388

(22) Filed: May 2, 2012

(65) Prior Publication Data

US 2013/0293135 A1 Nov. 7, 2013

(51) Int. Cl.
*H05B 37/02* (2006.01)

(52) U.S. Cl.
USPC ............................................. 315/224; 327/79

(58) Field of Classification Search
None
See application file for complete search history.

(56) References Cited

U.S. PATENT DOCUMENTS

| | | | |
|---|---|---|---|
| 5,886,512 A | 3/1999 | Becerra | |
| 6,381,151 B1 | 4/2002 | Jang | |
| 7,145,295 B1* | 12/2006 | Lee et al. | 315/291 |
| 7,345,894 B2 | 3/2008 | Sawtell et al. | |
| 7,550,934 B1* | 6/2009 | Deng et al. | 315/308 |
| 8,018,694 B1 | 9/2011 | Wu | |
| 2002/0163371 A1 | 11/2002 | Hall et al. | |
| 2006/0098464 A1 | 5/2006 | Osaka et al. | |
| 2006/0186830 A1* | 8/2006 | Shami et al. | 315/291 |
| 2007/0222485 A1 | 9/2007 | Ueda | |
| 2008/0094010 A1* | 4/2008 | Black | 315/307 |
| 2009/0295228 A1 | 12/2009 | Ochi | |
| 2010/0007999 A1 | 1/2010 | Iwata | |
| 2010/0039083 A1 | 2/2010 | Moriarty, Jr. | |
| 2010/0060203 A1* | 3/2010 | Holmes et al. | 315/307 |
| 2010/0123978 A1 | 5/2010 | Lin et al. | |
| 2010/0148697 A1 | 6/2010 | Bayat et al. | |
| 2010/0252840 A1 | 10/2010 | Ibbetson et al. | |
| 2010/0309689 A1 | 12/2010 | Coulson | |
| 2011/0096577 A1 | 4/2011 | Yamada | |
| 2011/0127925 A1 | 6/2011 | Huang et al. | |
| 2011/0148200 A1 | 6/2011 | Burns et al. | |
| 2011/0194312 A1 | 8/2011 | Gaknoki et al. | |
| 2012/0056552 A1 | 3/2012 | Yu et al. | |
| 2012/0091816 A1 | 4/2012 | Liu et al. | |
| 2012/0274228 A1* | 11/2012 | Szczeszynski | 315/224 |

OTHER PUBLICATIONS

PCT International Search Report and the Written Opinion of the International Search Authority, mailed Sep. 6, 2013 for International Application No. PCT/US2013/039069 (9 pages).
Notification of Transmittal of the International Search Report and the Written Opinion of the International Searching Authority, or the Declaration, PCT/US2013/067211, Date of Mailing: Mar. 27, 2014, 13 pages.

\* cited by examiner

*Primary Examiner* — Jany Richardson
(74) *Attorney, Agent, or Firm* — Myers Bigel Sibley & Sajovec, P.A.

(57) ABSTRACT

A voltage regulator for generating a housekeeping voltage in a high voltage power supply circuit includes a charging switch coupled to a high voltage node and to a storage device at an output node, and a control voltage regulation circuit coupled to the charging switch and configured to cause the charging switch to generate a current pulse for charging the storage device.

17 Claims, 4 Drawing Sheets

DRIVER CIRCUITS FOR DIMMABLE SOLID STATE LIGHTING APPARATUS

FIELD

The present inventive concept relates to driver circuits for solid state lighting apparatus.

BACKGROUND

Solid-state lighting arrays are used for a number of lighting applications. For example, solid-state lighting panels including arrays of solid-state light emitting devices have been used as direct illumination sources, for example, in architectural and/or accent lighting. A solid-state light emitting device may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Typically, a solid-state light emitting device generates light through the recombination of electronic carriers, i.e. electrons and holes, in a light emitting layer or region. A solid-state light emitting device may include, for example, a packaged light emitting device including one or more light emitting diodes (LEDs).

Cree, Inc. produces a variety of recessed downlights, such as the LR-6 and CR-6, which use LEDs for illumination. Solid-state lighting panels are also commonly used as backlights for small liquid crystal display (LCD) screens, such as LCD display screens used in portable electronic devices, and for larger displays, such as LCD television displays.

Solid state lighting devices are typically powered with a DC signal. However, power is conventionally delivered in AC form. It is therefore generally desirable for a solid state light fixture to include an AC/DC converter to convert AC line voltage to a DC voltage.

Boost converters can be used to generate DC voltage from an AC line voltage with high power factor and low total harmonic distortion. The voltage of an LED-based load may be higher than the peak of the input (line) AC voltage. In that case, a single-stage boost converter can be employed as the driver, achieving high power efficiency and low cost. For example, a power factor corrected (PFC) boost converter which converts 120V ac, 60 Hz, to 200-250V dc output could be used to drive an array of high-voltage (HV) LEDs at a power level of 10-15 W.

For general lighting applications, it is desirable for a solid state lighting apparatus to be compatible with a phase-cut dimming signal. Phase-cut dimmers are commonly used to reduce input power to conventional incandescent lighting fixtures, which causes the fixtures to dim. Phase-cut dimmers only pass a portion of the input voltage waveform in each cycle. Thus, during a portion of a phase-cut AC input signal, no voltage is provided to the fixture.

Compatibility with phase cut dimming signals is also feasible for LED drivers based on boost converters. One low cost approach is to use open-loop control, which means a driver will not respond to the LED current decrease due to phase cut dimming, but rather keep the preset input current during dimmer conduction time. In this way, a 'natural' dimming performance is achieved, and input power, and thus LED current will reduce as the dimmer conduction time decreases. One other approach is for drivers to use closed-loop control. As control loops are complete and in effect, these drivers will try to compensate the input power decrease due to dimmer phase cut. In order to dim LEDs in these cases, the control loops should be saturated so that the input current cannot increase. The control loop saturation can be realized by clamping the output of an error amplifier, for example.

Another challenge due to phase cut dimming is for the boost converter to generate the bias voltage that is used to power the control circuits of the boost converter (so-called "housekeeping power") during deep dimming. Conventional LED driver circuits draw housekeeping power from the auxiliary winding of a boost circuit inductor. Depending on how much of the input waveform is cut by the dimmer, during the dimmer off period, the control circuits can lose power. This can cause the entire driver circuit to cut off, which can result in visible flicker of the solid state lighting apparatus or other issues.

SUMMARY

A voltage regulator according to some embodiments includes a charging switch including a first terminal coupled to a high voltage node, a second terminal, and a control terminal, a rectifier coupled to the second terminal of the charging switch, an output capacitor coupled to the rectifier, a control switch coupled to the second terminal, and a control voltage regulation circuit coupled to the control terminal of the charging switch. The control switch and the charging switch are configured so that when the control switch is turned off, a rise in voltage on the control switch causes an increase in voltage on the control terminal of the charging switch sufficient to allow a charging current to flow through the rectifier and into the output capacitor. The control voltage regulation circuit is configured to dissipate the increased voltage on the control switch so that the charging current only flows for a limited period of time in response to the control switch being turned off.

The control voltage regulation circuit may include a clamping diode coupled to the control terminal of the charging switch.

The voltage regulator may further include a resistor in parallel with the clamping diode and configured to allow a voltage clamped by the clamping diode to dissipate. A resistance of the resistor is selected to provide a desired pulse width of the charging current.

The control switch has a parasitic capacitance that is charged when the control switch is turned off thereby causing the rise in voltage on the control switch.

In some embodiments, the control voltage regulation circuit may include a Zener diode coupled to a voltage node, a first resistor coupled between the voltage node and a voltage source, a clamping diode coupled to the control terminal of the charging switch, a second resistor coupled in parallel with the clamping diode, a third resistor coupled between the clamping diode and the voltage node, and a capacitor coupled to the voltage node. The second and third resistors and the capacitor may be configured to dissipate the increased voltage on the control terminal of the charging switch. The charging switch is configured to turn off in response to dissipation of the increased voltage on the control terminal of the charging switch.

In some embodiments, the voltage regulator may further include a main inductor, a zero crossing detection (ZCD) circuit configured to generate a zero cross detection signal in response to current through the main inductor falling to zero, and a control circuit configured to selectively activate the control switch in response to the zero cross detection signal. The zero crossing detection signal is configured to generate the zero cross detection signal to have a sufficient voltage swing to trigger a zero cross detection by the control circuit.

In some embodiments, the zero crossing detection circuit may include a capacitor coupled to the high voltage node and to a first node, a first resistor coupled to the capacitor and to a ZCD output node, a second resistor coupled to the ZCD output node, a first diode including an anode coupled to the first node and including a cathode, a second resistor coupled to the cathode of the diode, and a second diode including a cathode coupled to the second resistor.

In other embodiments, the zero crossing detection circuit may include a first resistor coupled to the high voltage node, a first Zener diode having a cathode coupled to the first resistor and having an anode coupled to a ZCD output node, a second Zener diode having a cathode coupled to the ZCD output node, a second resistor coupled to the ZCD output node, and a capacitor coupled to the ZCD output node.

Some embodiments provide a voltage regulator for generating a housekeeping voltage in a power supply circuit. The voltage regulator includes a charging switch coupled to a high voltage node and to an output capacitor, and a control voltage regulation circuit coupled to a control terminal of the charging switch. The control switch and the charging switch are configured so that when the control switch is turned off, a rise in voltage on the control switch causes an increase in voltage on the control terminal of the charging switch sufficient to allow a charging current to flow into the output capacitor. The control voltage regulation circuit is configured to dissipate the increased voltage on the control switch so that the charging current only flows for a limited period of time in response to a state transition of the control switch.

A voltage regulator for generating a housekeeping voltage in a power supply circuit according to further embodiments includes a charging switch coupled to a high voltage node and to an output capacitor, and a control voltage regulation circuit coupled to the charging switch and configured to cause the charging switch to generate a current pulse for charging the output capacitor in response to a control signal.

In accordance with further embodiments of the invention, a method of generating a low voltage in a high voltage power supply includes generating a high voltage at a voltage node, and in response to a change in a voltage level at the voltage node, generating a pulse of current for charging an output capacitor to a level that is lower than the high voltage.

BRIEF DESCRIPTION OF THE DRAWINGS

The accompanying drawings, which are included to provide a further understanding of the inventive subject matter and are incorporated in and constitute a part of this application, illustrate certain embodiment(s) of the inventive subject matter. In the drawings.

DETAILED DESCRIPTION OF EMBODIMENTS

Embodiments of the present inventive subject matter now will be described more fully hereinafter with reference to the accompanying drawings, in which embodiments of the inventive subject matter are shown. This inventive subject matter may, however, be embodied in many different forms and should not be construed as limited to the embodiments set forth herein. Rather, these embodiments are provided so that this disclosure will be thorough and complete, and will fully convey the scope of the inventive subject matter to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. Throughout the specification, like reference numerals in the drawings denote like elements.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

The expression "lighting apparatus", as used herein, is not limited, except that it indicates that the device is capable of emitting light. That is, a lighting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

Some embodiments of the invention provide electronic circuits that address various needs in a dimmable LED driver circuit and/or that enable a wide range of dimming (e.g., down to 1%) with low-cost components. Embodiments of the invention are described herein in connection with a boost (step-up) converter. However, the invention is not limited to boost converters and may be used in connection with other types of circuits, such as, for example, buck (step-down), buck-boost, SEPIC, and/or other switch-mode power supply topologies and/or other voltage converter topologies.

Instead of drawing the control circuit voltage from the auxiliary winding of a boost converter inductor, some embodiments generate a DC housekeeping voltage from a high voltage level found in the boost converter, such as a rectified line voltage. However, the rectified line voltage may be substantially higher than the voltage level needed to power the driver circuitry (e.g., 150 V vs 15 V). This difference in voltage may result in undesirable losses in the control voltage generation circuit.

Figure 1:
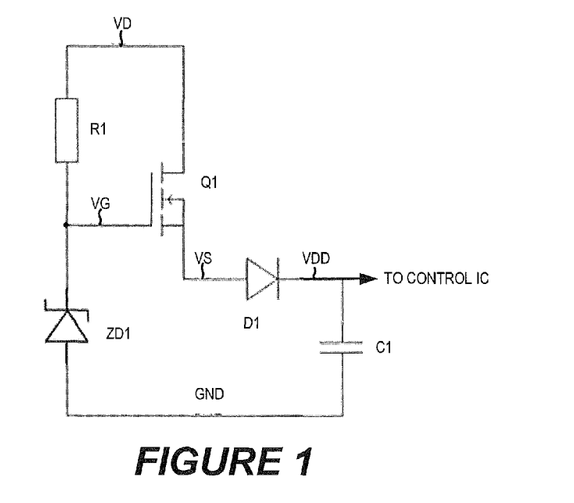
FIG. 1 is a circuit diagram of a linear voltage regulator that can be used to generate a control circuit voltage.

For example, a linear voltage regulator having a cascoded switch topology that can be used to generate a relatively low control circuit voltage is illustrated in FIG. 1. The function of the circuit is to generate a relatively low bias "housekeeping" voltage VDD (typically about 15 V) from a high-voltage source VD (e.g., 150 V), which can be a rectified line voltage, as noted above.

The linear voltage regulator circuit shown in FIG. 1 includes a Zener diode ZD1, a resistor R1, a charging switch Q1, a diode D1 and an output capacitor C1. The Zener diode ZD1 and the resistor R1 form a gate voltage regulation circuit that supplies a gate voltage equal to the Zener voltage of the Zener diode to the gate of the charging switch Q1. The charging switch Q1 is illustrated as a MOSFET transistor switch in FIG. 1. However, it will be appreciated that other types of transistor switches, such as bipolar junction transistors, can be used instead.

After power up, a DC voltage VG is generated through the resistor R1 and the Zener diode ZD1 (e.g., 18V). The charging switch Q1 conducts when its gate-to-source voltage (VG-VS) is larger than a threshold value Vth (e.g., 2 V). The diode D1 conducts as long as VS-VDD is larger than the forward voltage Vd of the diode D1 (e.g., 1 V). Consequently, the output capacitor C1 charges through charging switch Q1 and diode D1 as long as VG-VDD is larger than Vth+Vd, and the final value of VDD equals to VG-Vth-Vd. If VDD rises to a level greater than VG-Vth-Vd, the charging switch Q1 ceases to conduct, and the capacitor is no longer charged by the voltage VD. The capacitor can then supply the bias voltage VDD until the charge on the capacitor drops to the point that VDD is less than VG-Vth-Vd, at which point the voltage VD begins to charge the output capacitor C1 again.

This linear regulation structure is able to provide very fast start-up and a constant dc bias voltage VDD. However, it may suffer the disadvantage of a large power loss, especially when VD is much higher than VDD. The large power loss is due to the operation of the MOSFET charging switch Q1 in saturation mode (or linear operation mode if the charging switch Q1 is a bipolar transistor) and the large voltage drop VD-VDD across the charging switch Q1. For instance, if VD is ten times VDD, the power loss on Q1 is nine times the power delivered to the output capacitor C1.

In order to provide a linear regulation structure that has reduced power loss, embodiments of the present inventive concept enable the charging of the output capacitor for limited intervals every switching period. This approach can be realized by manipulating the gate voltage of the charging switch. For example, referring to FIG. 2, an example is shown based on a boost converter 100. The boost converter 100 is configured to supply two different DC output voltages, namely, a high voltage Vout that can be used to drive a load, such as a solid state lighting apparatus, and a lower voltage VDD that can be used as "housekeeping power," for example, to power a control circuit 20.

Figure 2:
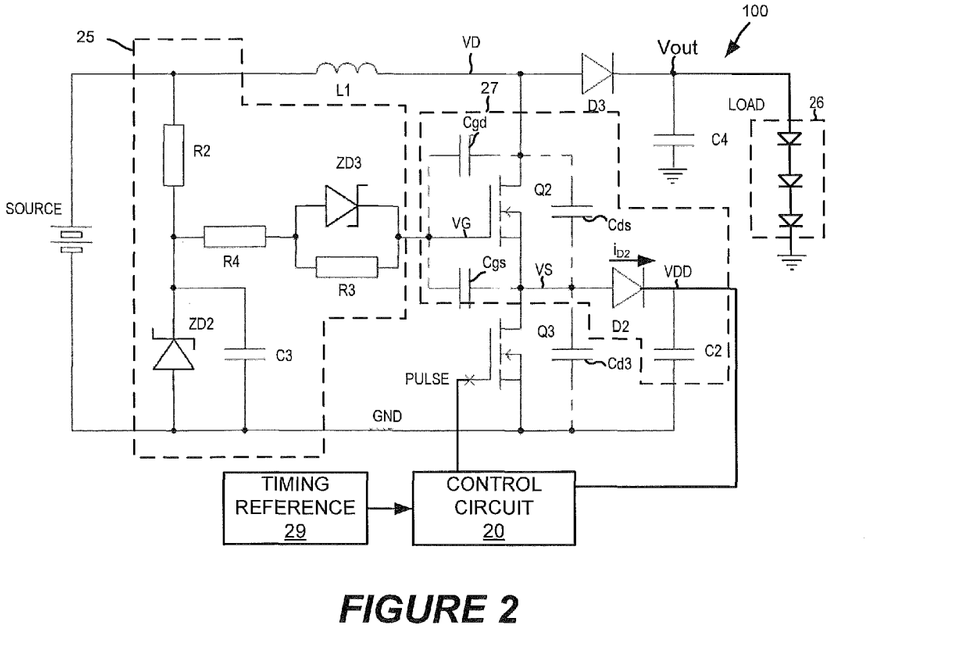
FIG. 2 is a circuit diagram of a voltage regulator circuit according to embodiments of the inventive concepts that can be used to generate a control circuit voltage.

The basic structure of the boost converter 100 includes a main inductor L1, a switch structure including a charging switch Q2 and a control switch Q3, a primary rectifying diode D3 and a primary output capacitor C4 that provides an output voltage to a load 26, which may, for example, be a solid state lighting device including a plurality of light emitting diodes. In particular embodiments, the load 26 may include high voltage LEDs, including LEDs having forward voltages in excess of 4 Volts. High voltage LEDs are disclosed, for example, in U.S. patent application Ser. No. 12/814,241 to Ibbetson et al., entitled "High Voltage Low Current Surface Emitting LED, the disclosure of which is incorporated by reference herein in its entirety. Other high voltage LEDs, such as XB-D LEDs manufactured by the assignee of the present invention, may be used in the load. At least some of the light emitting diodes of the load may be connected in series, so that the forward voltage required to drive the light emitting diodes may be relatively high, e.g., greater than 100 V.

In some embodiments, the DC output voltages provided to the load 26 could be between about 180V and about 500V+/−10%, respectively with the boost. With a buck-boost converter, the output voltages could be between about 50V and about 250V. The power levels of the converter could vary considerably from 2 W to 200 W. Typical line (AC) voltage ranges are 100Vac, 120Vac, 230Vac, 277Vac with +/−10% variation at a frequency of 50/60 Hz.

The charging switch Q2 may be rated for high voltage (e.g., 250V or more) while the control switch Q3 is a low-voltage switch (e.g., ~20V) and can be internal to the controller (such as, for example, a model TPS92210 power factor correcting LED lighting driver controller manufactured by Texas Instruments Incorporated).

Referring still to FIG. 2, a control voltage regulation circuit 25 is provided to regulate the gate voltage on the charging switch Q2. The control voltage regulation circuit 25 includes resistors R2, R3, R4, Zener diodes ZD2, ZD3 and a capacitor C3. The resistors R3 and R4 and Zener diode ZD3 are connected between the cathode of the Zener diode ZD2 and the gate of the charging switch Q2. The Zener diode ZD3 may have a Zener voltage of, e.g., 4.7 V. A charging circuit 27 is formed by the charging switch Q2, a secondary rectifying diode D2 and a secondary output capacitor C2.

In the boost converter of FIG. 2, the charging switch Q2 and the control switch Q3 are MOSFET transistor devices; however, other types of transistor devices could be used to implement the switches. The drain of the charging transistor Q2 is coupled to the main inductor L1 and the anode of the primary rectifying diode D3 at a node VD. The gate of the charging transistor Q2 is coupled to the control voltage regulation circuit 25 at a node VG, and the source of the charging transistor is coupled to the anode of the secondary rectifying diode D2 at a node VS. A number of parasitic capacitances are associated with the charging switch Q2, including a gate-to-drain capacitance Cgd, a drain-to-source capacitance Cds, and a gate-to-source capacitance Cgs.

The control switch Q3 is coupled to the node VS and has an associated parasitic capacitance Cd3.

The primary output capacitor C4 is coupled to the cathode of the primary rectifying diode D3 at a node Vout, and the secondary output capacitor C2 is coupled to the cathode of the secondary rectifying diode D2 at a node VDD.

A control circuit 20 receives power from the secondary output capacitor C2 at node VDD. The control circuit 20 has an output coupled to the gate of the control switch Q3, and controls the operation of the control switch Q3 in response to a timing signal provided by a timing reference circuit 29. As discussed in more detail below, the timing reference circuit 29 may include a zero crossing detection (ZCD) circuit that detects when a current through the main inductor L1 falls to zero.

Figure 3:
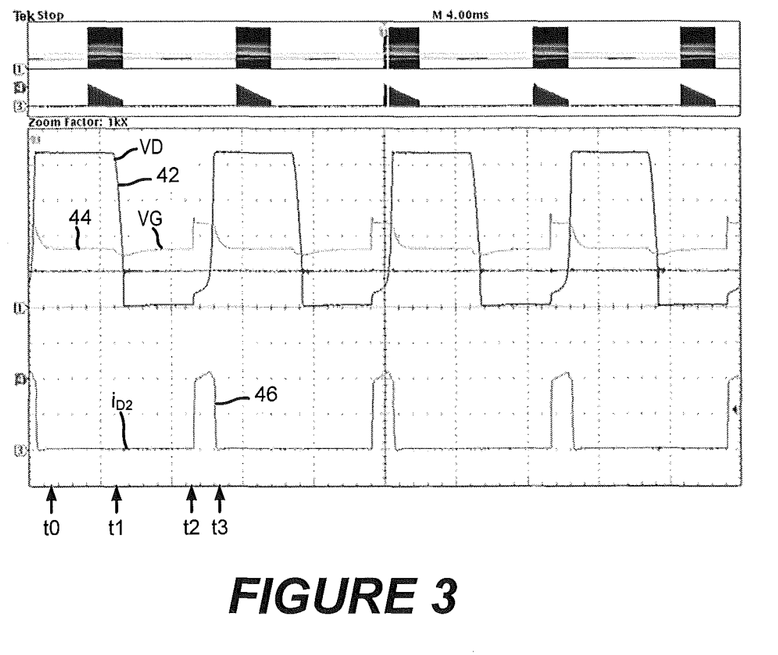
FIG. 3 is a graph of waveforms associated with the voltage regulator circuit shown in FIG. 2.

FIG. 3 is a waveform diagram illustrating operation of the circuit of FIG. 2. In FIG. 3, curve 42 represents the voltage VD at the drain of the charging switch Q2, curve 44 represents the voltage VG at the gate of the charging switch Q2, and curve 46 represents the current $i_{D2}$ through the secondary rectifying diode D2.

Referring again to FIG. 2, the secondary output capacitor C2 is charged only for a brief period after the on-to-off transitions of switches Q3-Q2 as discussed below. When the control and charging switches Q3 and Q2 are on, the main inductor L1 is charged by the input voltage source and reaches a certain current. In an embodiment with transition mode control with a controller such as a model L6562A driver controller manufactured by STMicroelectronics, Inc., the inductor current ramps up in a linear fashion from zero to a peak value ipeak. When control switch Q3 is switched off, the inductor current (ipeak) through the main inductor L1 charges the parasitic capacitance Cd3 of the control switch Q3 and brings its drain voltage at node VS up from zero. During this transition, VG, the gate voltage of the charging switch Q2, is temporarily boosted up due to parasitic capacitance of the charging switch Q2, Zener diode D3 and resistor R3. This voltage is clamped by the Zener diode ZD3.

Referring to FIG. 2 and FIG. 3, at time t0, VD (curve 42) is high. VG (curve 44) is clamped at about 18V. At time t1, the control circuit 20 turns on the transistor Q3. At this point, voltage VD drops to zero, causing current through the inductor L1 to increase up to a peak value. At time t2, the transistor switch Q3 is turned off by the control circuit 20. This causes the voltages at nodes VS and VD to rise as the parasitic capacitances are charged by inductor current. In addition, the voltage at node VG increases sharply when the transistor switch Q3 is turned off as the gate-source capacitance of the charging switch Q2 holds charge. The voltage at node VG is clamped by the Zener diode ZD3. This voltage holds for a short period (t2-t3) due to the current charging the gate-drain capacitance of Q2 until the voltage at node VD settles at the primary output voltage. During this period, the charging channel through the secondary rectifying diode D2 is open, resulting in a charging current (curve 46) flowing into the secondary output capacitor C2. As the parasitic capacitance at the gate of the charging switch Q2 discharges, the voltage at node VG decreases, which turns off the charging switch Q1 when its gate-source voltage is below the threshold, causing the charging current flowing through the secondary rectifying diode D2 to drop off to zero at time t3.

The resistor R3 has a resistance value that is selected to slow down the discharge of the gate-source capacitance of the charging switch Q2 but at the same time defines the width of the charging pulse. During this time, as seen in the waveforms of FIG. 3 (namely, the bump in the voltage VG at time t2), the charging switch Q2 is on and the inductor current is charging the secondary output capacitor C2. As the gate-source voltage of the charging switch Q2 decays and the charging switch Q2 starts going into saturation, the voltage at node VD rises until the primary rectifying diode D3 conducts and clamps it to Vout. As long as the voltage at node VD reaches the output voltage, the charging of the parasitic capacitances stops and the voltage at node VG returns to the voltage set by the Zener diode ZD2.

With proper component values, the charging of the secondary output capacitor C2 occurs only when the voltage at node VG is boosted up during the on-to-off-transition of the control transistor Q3, which may reduce the power loss normally associated with charging the secondary output capacitor C2 when the voltage at node VD is high.

One major cost item in a switch mode power supply or a driver (for LEDs) is the main inductor that has an auxiliary winding. The auxiliary winding is needed to generate auxiliary power or bias power (housekeeping power) at around 12-15V to power the control circuitry. Having the auxiliary winding makes the inductor a custom part where the ratio of primary to auxiliary turns has to be managed and an inductor core such as a toroid or EE core with bobbin has to be used. This increases the cost of the inductor. Being able to generate an auxiliary power supply without the use of auxiliary winding may allow the use of a less expensive inductor. The inductor on a toroid or EE core could be 10-30% less expensive than one with an auxiliary winding. However, embodiments of the invention may allow the use of a standard off-the-shelf drum core inductor which could be less than half the cost of a custom inductor with auxiliary winding.

Once the energy in the main inductor L1 is completely delivered to the output, the inductor current falls to zero and the primary rectifying diode D3 reverse biases. A resonance between the main inductor L1 and the capacitance at node VD drives the voltage VD down. This voltage needs to be detected in order to initiate a new switching period. When the auxiliary winding on the boost circuit inductor is used for housekeeping power, it is easy to sense the voltage on the winding and make the decision to start a new switching period. Without an auxiliary winding, a typical approach is to use RC coupling to convey the VD node signal to the controller. With a boost converter and with dimming, there are certain limitations to this 'zero cross detection' (ZCD) method. Embodiments of the invention provide additional circuitry for determining when to start a new switching period as discussed in more detail below.

Figure 4:
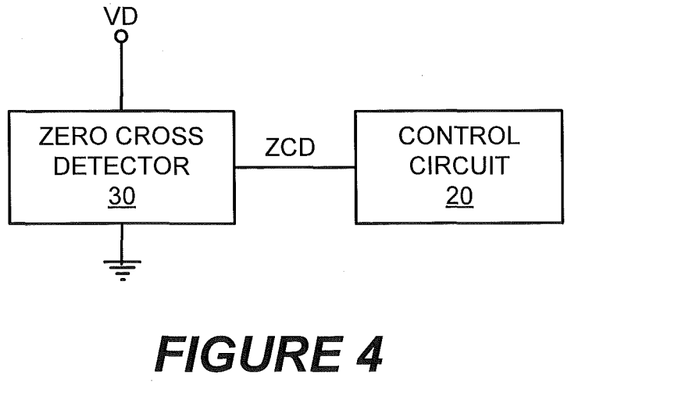
FIG. 4 is a block diagram of a zero cross detection circuit.

For voltage converters operating in critical conduction mode (CRM, boundary mode, or transition mode), it is desirable to provide a zero cross detection (ZCD) signal to the control circuit 20 to trigger a new switch on period. The ZCD signal indicates that the current through the main inductor has reached zero, and is commonly generated with a secondary winding of the main inductor L1. If the secondary winding is unavailable, the ZCD signal can also be generated with an RC network. As shown in FIG. 4, a zero cross detector 30 may be coupled between the voltage VD and ground and may generate a zero cross detection signal ZCD that is provided to the control circuit 20 when the current through the main inductor L1 has reached zero.

Figure 5:
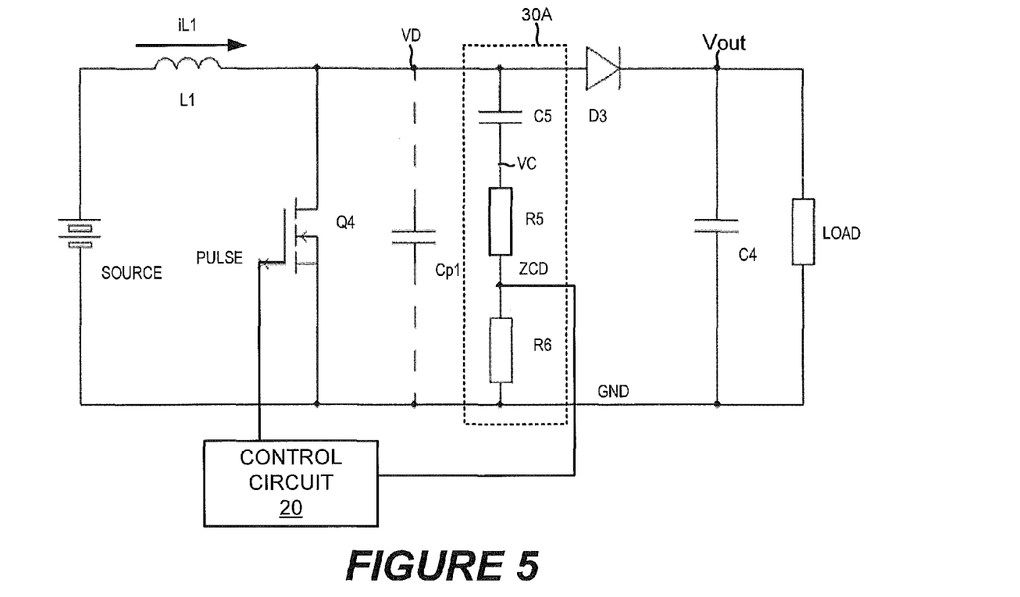
FIGS. 5-7 are circuit diagrams of zero cross detection circuits according to embodiments of the inventive concepts.

A ZCD detection circuit 30A according to some embodiments based on a boost converter topology is shown in FIG. 5.

The ZCD detection circuit 30A in FIG. 5 includes a capacitor C5 and resistors R5, R6 coupled between the output of the inductor L1 (i.e. the location of the voltage VD) and ground.

The voltage at the node between the resistor R5 and the capacitor C5 is denoted VC. A transistor switch Q4 which is controlled by a control circuit 20 is also coupled between VD and ground along with an associated parasitic capacitance Cp1.

During the time when the switch Q4 is off and diode D3 is conducting, the output voltage Vout is approximately equal to VD, and the ZCD detection capacitor C5 is charged through the resistors R5 and R6. When the inductor current iL1 decreases to zero, the diode D3 turns off and VD decreases due to the resonance between inductor L1 and parasitic capacitance Cp1. As the capacitor C5 is able to hold its voltage, the voltage at node VC follows the variation of voltage at node VD. By choosing an appropriate ratio between R5 and R6, a ZCD signal can be generated and fed to the control circuit 20.

The voltage level on the capacitor C5 and the speed required to get to that level may be selected so that a correct ZCD signal is provided, especially when the circuit has to be compatible with phase-cut dimmers. The threshold voltages for the ZCD signal in typical control circuits are normally low voltages (close to zero). A high-to-low transition of the ZCD signal triggers a new switching-on interval.

In a boost converter, when the peak input voltage (e.g. 180V) is close to the output voltage (e.g. 190V) the resonant swing of the voltage VD may be small (e.g. 20V-twice the difference) at the peak. If the DC voltage on the capacitor C5 is low, then the voltage signal ZCD may not be able to swing low enough to trigger a zero crossing detection by the control circuit 20. To better ensure correct ZCD triggering, the voltage on capacitor C5 may be large enough to allow correct ZCD triggering, but lower than the output voltage Vout. Furthermore, this large value may be reached within one switching period.

When the switch Q4 is conducting, the voltage at VD is close to zero, and the capacitor C5 is discharged through R5, R6 and Q4. Similarly, the voltage on the capacitor C5 can decrease to zero during a long off period due to dimming. However, as soon as the voltage level VD goes high, the capacitor C5 should be charged to a high voltage as quickly as possible. These requirements can be met by manipulating the voltage on the capacitor C5 and charging/discharging C5 with different speeds. One circuit to realize these functions is shown in FIG. 6.

Figure 6:
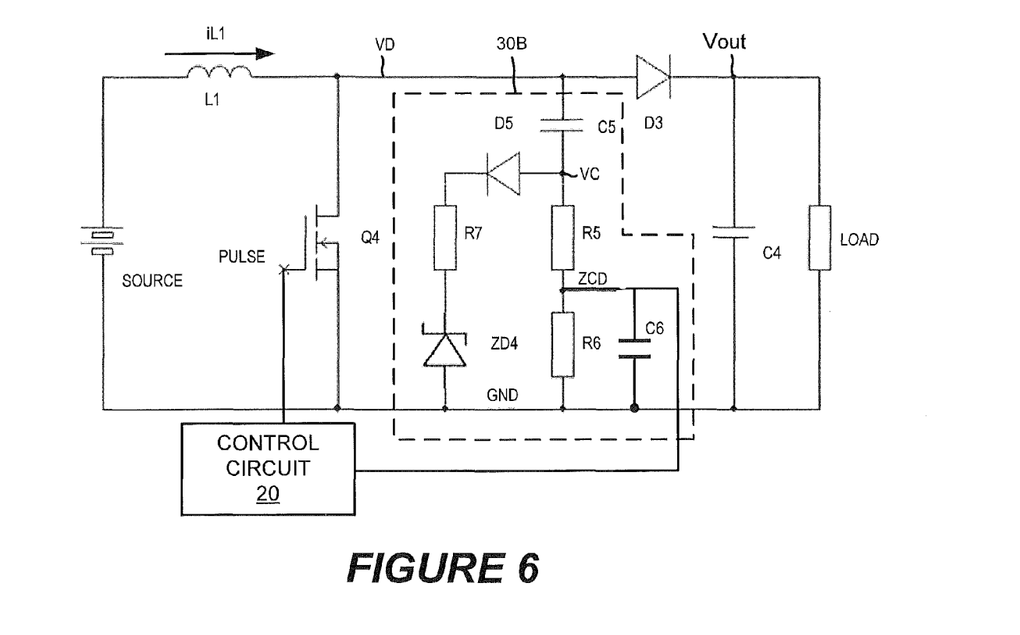

Referring to FIG. 6, a ZCD detection circuit 30B includes capacitors C5 and C6, a diode D5, a Zener diode ZD4 and resistors R5, R6 and R7 connected as shown between the output of the inductor L1 and ground.

With the circuit shown in FIG. 6, the capacitor C5 is mostly charged though the diode D5, resistor R7 and Zener diode ZD4 when VD is high. The small resistance of R7 leads to fast charging, while the Zener diode ZD4 defines the maximum voltage on C5, which is roughly the output voltage Vout minus the Zener voltage of ZD4. The Zener diode ZD4 is provided so that the voltage at ZCD is able to go higher than the trigger threshold when VD is high. When VD is low, C5 is discharged through R5 and R6, while the R7 branch is blocked by diode D5. Thus, the discharging can be slowed by using high-resistance values for R5 and R6. The capacitor C6 is used to introduce a little delay to ZCD signal. With this configuration, the voltage on C5 can be close to, but less than the output voltage; thus, a correct ZCD signal can be generated.

Figure 7:
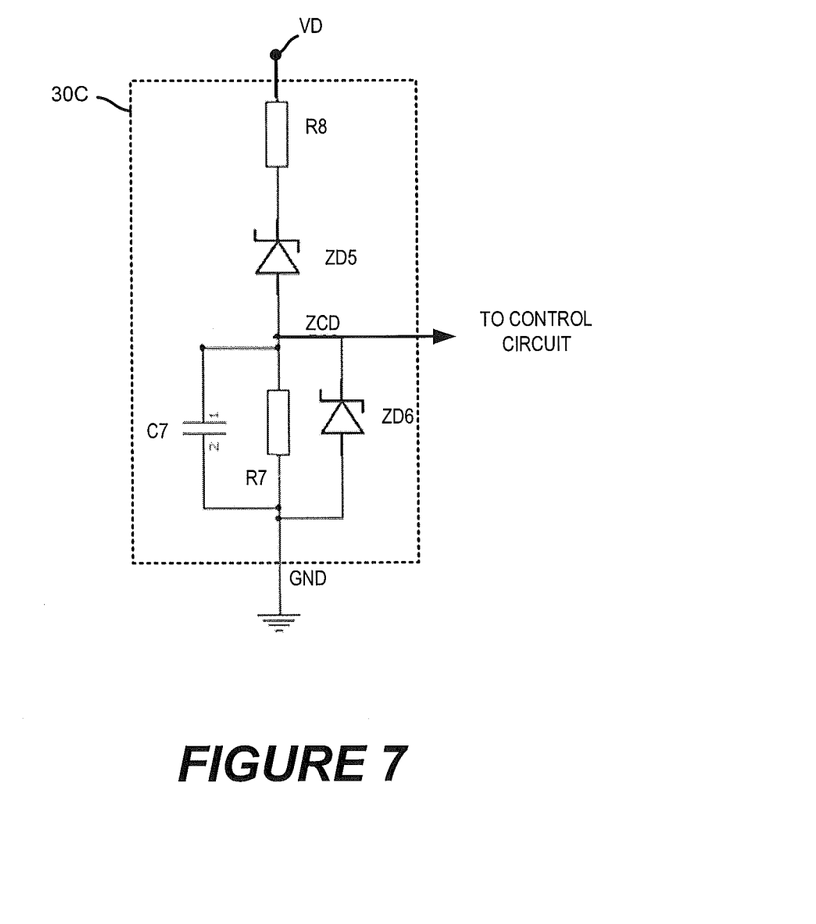

Another zero cross detection circuit 30C that can generate a suitable zero current detection signal is illustrated in FIG. 7. The ZCD circuit 30C includes resistors R7 and R8, Zener diodes ZD5 and ZD6, and a capacitor C7.

In the circuit 30C, the Zener diode ZD5 is a high voltage Zener diode (e.g., 180V). When VD drops below the Zener voltage of the Zener diode ZD5, the voltage at node ZCD will collapse to zero as R7 discharges the capacitor C7. This triggers the zero crossing detection threshold (e.g., 0.7V). When the voltage VD rises above the voltage on the Zener diode ZD5, the voltage at node ZCD rises above another threshold required for resetting the control circuit (e.g., 1.4V) which readies the control circuit for the next zero crossing event. The Zener diode ZD6 clamps the voltage level of the ZCD signal if necessary (e.g., at 4.7V).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A voltage regulator, comprising:
   a charging switch including a first terminal coupled to a high voltage node, a second terminal, and a control terminal;
   a rectifier coupled to the second terminal of the charging switch;
   an output capacitor coupled to the rectifier;
   a control switch coupled to the second terminal; and
   a control voltage regulation circuit coupled to the control terminal of the charging switch;
   wherein the control switch and the charging switch are configured so that when the control switch is turned off, a rise in voltage on the control switch causes an increase in voltage on the control terminal of the charging switch sufficient to allow a charging current to flow through the rectifier and into the output capacitor; and
   wherein the control voltage regulation circuit is configured to dissipate the increased voltage on the control switch so that the charging current only flows for a limited period of time in response to the control switch being turned off.

2. The voltage regulator of claim 1, wherein the control voltage regulation circuit comprises a clamping diode coupled to the control terminal of the charging switch.

3. The voltage regulator of claim 2, further comprising:
   a resistor in parallel with the clamping diode and configured to allow a voltage clamped by the clamping diode to dissipate.

4. The voltage regulator of claim 3, wherein a resistance of the resistor is selected to provide a desired pulse width of the charging current.

5. The voltage regulator of claim 1, wherein the control switch has a parasitic capacitance that is charged when the control switch is turned off thereby causing the rise in voltage on the control switch.

6. The voltage regulator of claim 5, wherein the control voltage regulation circuit comprises:
   a Zener diode coupled to a voltage node;

a first resistor coupled between the voltage node and a voltage source;
a clamping diode coupled to the control terminal of the charging switch;
a second resistor coupled in parallel with the clamping diode;
a third resistor coupled between the clamping diode and the voltage node; and
a capacitor coupled to the voltage node.

7. The voltage regulator of claim 6, wherein the second and third resistors and the capacitor are configured to dissipate the increased voltage on the control terminal of the charging switch.

8. The voltage regulator of claim 7, wherein the charging switch is configured to turn off in response to dissipation of the increased voltage on the control terminal of the charging switch.

9. The voltage regulator of claim 1, further comprising:
a main inductor;
a zero crossing detection (ZCD) circuit configured to generate a zero cross detection signal in response to current through the main inductor falling to zero; and
a control circuit configured to selectively activate the control switch in response to the zero cross detection signal;
wherein the zero crossing detection signal is configured to generate the zero cross detection signal to have a sufficient voltage swing to trigger a zero cross detection by the control circuit.

10. The voltage regulator of claim 9, wherein the zero crossing detection circuit comprises:
a capacitor coupled to the high voltage node and to a first node;
a first resistor coupled to the capacitor and to a ZCD output node;
a second resistor coupled to the ZCD output node;
a first diode including an anode coupled to the first node and including a cathode;
a third resistor coupled to the cathode of the diode; and
a second diode including a cathode coupled to the second resistor, wherein the second diode comprises a Zener diode.

11. The voltage regulator of claim 9, wherein the zero crossing detection circuit comprises:
a first resistor coupled to the high voltage node;
a first Zener diode having a cathode coupled to the first resistor and having an anode coupled to a ZCD output node;
a second Zener diode having a cathode coupled to the ZCD output node;
a second resistor coupled to the ZCD output node; and
a capacitor coupled to the ZCD output node.

12. A voltage regulator for generating a secondary voltage in a power supply circuit, the voltage regulator comprising:
a charging switch coupled to a high voltage node and to an output capacitor; and
a control voltage regulation circuit coupled to a control terminal of the charging switch;
wherein the control switch and the charging switch are configured so that when the control switch is turned off, a rise in voltage on the control switch causes an increase in voltage on the control terminal of the charging switch sufficient to allow a charging current to flow into the output capacitor; and
wherein the control voltage regulation circuit is configured to dissipate the increased voltage on the control switch so that the charging current only flows for a limited period of time in response to a state transition of the control switch.

13. A voltage regulator for generating a secondary voltage in a power supply circuit, the voltage regulator comprising:
a charging circuit coupled to a switching node, a high voltage node and a secondary voltage output node;
a storage element coupled to the secondary voltage output node; and
a control voltage regulation circuit coupled to the charging circuit and configured to cause the charging circuit to generate a current pulse for charging the storage element;
wherein the secondary voltage is supplied by the storage element; and
wherein the control voltage regulation circuit is further configured to cause the switching circuit to disconnect the switching node from the high voltage node after the current pulse is generated.

14. A method of generating a low voltage in a high voltage power supply, the method comprising:
generating a high voltage at a voltage node that is coupled to a primary output capacitor;
in response to a change in a voltage level at the voltage node, generating a pulse of current for charging a secondary output capacitor to a level that is lower than the high voltage; and
outputting the high voltage to the primary output capacitor after generating the pulse of current.

15. A solid state lighting device, comprising:
a solid state load comprising a plurality of solid state light emitting devices; and
a power supply circuit that generates a primary voltage and supplies the primary voltage to the solid state load;
wherein the power supply circuit comprises a voltage regulator that generates a secondary voltage that is lower than the primary voltage, the voltage regulator comprising:
a charging circuit coupled to a switching node, a high voltage node and a secondary voltage output node;
a storage element coupled to the secondary voltage output node; and
a control voltage regulation circuit coupled to the charging circuit and configured to cause the charging circuit to generate a current pulse for charging the storage element;
wherein the secondary voltage is supplied by the storage element; and
wherein the control voltage regulation circuit is further configured to cause the switching circuit to disconnect the switching node from the high voltage node after the current pulse is generated.

16. A zero crossing detection (ZCD) circuit that generate a zero crossing detection signal in response to current through an inductor falling to zero, comprising:
a capacitor coupled to the inductor and to a first node;
a first resistor coupled to the capacitor and to a ZCD output node;
a second resistor coupled to the ZCD output node;
a first diode including an anode coupled to the first node and including a cathode;
a third resistor coupled to the cathode of the diode; and
a second diode including a cathode coupled to the second resistor, wherein the second diode comprises a Zener diode.

17. A zero crossing detection (ZCD) circuit that generate a zero crossing detection signal in response to current through an inductor falling to zero, comprising:
- a first resistor coupled to the inductor;
- a first Zener diode having a cathode coupled to the first resistor and having an anode coupled to a ZCD output node;
- a second Zener diode having a cathode coupled to the ZCD output node;
- a second resistor coupled to the ZCD output node; and
- a capacitor coupled to the ZCD output node.

* * * * *